(12) United States Patent
Tateyama et al.

(10) Patent No.: US 6,749,688 B2
(45) Date of Patent: Jun. 15, 2004

(54) COATING METHOD AND APPARATUS FOR SEMICONDUCTOR PROCESS

(75) Inventors: Kiyohisa Tateyama, Kumamoto (JP); Kimio Motoda, Kumamoto (JP); Noriyuki Anai, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 92 days.

(21) Appl. No.: 09/270,781

(22) Filed: Mar. 17, 1999

(65) Prior Publication Data

US 2002/0110640 A1 Aug. 15, 2002

Related U.S. Application Data

(62) Division of application No. 08/919,503, filed on Aug. 28, 1997, now Pat. No. 5,919,520.

(30) Foreign Application Priority Data

Aug. 30, 1996 (JP) .............................................. 8-249226

(51) Int. Cl.⁷ .......................... B05B 7/16; B05B 13/04; B05C 11/10
(52) U.S. Cl. ...................... 118/667; 118/680; 118/315; 118/323
(58) Field of Search ................................ 118/663, 315, 118/225, 668, 671, 680, 712, 411, 412, 313, 314, 323, 667, 666; 427/420, 299; 425/463

(56) References Cited

U.S. PATENT DOCUMENTS

| 3,457,094 A | | 7/1969 | Elmendorf et al. | |
| 4,451,507 A | | 5/1984 | Beltz et al. | |
| 4,510,176 A | | 4/1985 | Cuthbert et al. | |
| 4,964,362 A | * | 10/1990 | Dominguez | 118/315 |
| 4,968,528 A | | 11/1990 | Tanaka et al. | |
| 5,094,884 A | | 3/1992 | Hillman et al. | |
| 5,183,508 A | * | 2/1993 | Cholinski | 118/683 |
| 5,202,164 A | | 4/1993 | Takahashi et al. | |
| 5,250,116 A | | 10/1993 | Tanimoto | |
| 5,306,523 A | | 4/1994 | Shibata | |
| 5,397,600 A | | 3/1995 | Shibata et al. | |
| 5,437,727 A | * | 8/1995 | Yoneda et al. | 118/669 |
| 5,518,773 A | | 5/1996 | Shibata et al. | |
| 5,569,494 A | | 10/1996 | Suzuki et al. | |
| 5,658,615 A | * | 8/1997 | Hasebe et al. | 427/240 |
| 5,705,223 A | | 1/1998 | Bunkofske | |
| 5,826,129 A | * | 10/1998 | Hasebe et al. | 396/611 |

FOREIGN PATENT DOCUMENTS

| EP | 0 323 186 | 7/1989 |
| EP | 0 429 272 | 5/1991 |
| JP | 1991-0019110 | 11/1991 |
| JP | 4-372113 | 12/1992 |
| JP | 7-8879 | 1/1995 |
| JP | 7-8880 | 1/1995 |
| JP | 7-80384 | 3/1995 |
| JP | 7-80385 | 3/1995 |
| JP | 7-80386 | 3/1995 |
| JP | 7-31168 | 6/1995 |
| WO | WO 92/16023 | 9/1992 |

* cited by examiner

*Primary Examiner*—Richard Crispino
*Assistant Examiner*—George R. Koch, III
(74) *Attorney, Agent, or Firm*—Oblon, Spivak, McClelland, Maier & Neustadt, P.C.

(57) ABSTRACT

A coating apparatus has a spin chuck for attracting and holding a semiconductor wafer in a horizontal state by means of vacuum. A movable beam is arranged above the spin chuck. The movable beam includes first and second nozzles integrally formed. The first nozzle is used for supplying a photo-resist liquid while the second nozzle is used for supplying a solvent for the photo-resist liquid. When a coating process is performed, the movable beam above the wafer is horizontally moved in one direction. The solvent is first supplied onto the wafer from the second nozzle, and the coating or photo-resist liquid is then supplied from the first nozzle, following the solvent. Wettability of the wafer relative to the photo-resist is increased by the solvent, prior to supply of the photo-resist liquid.

8 Claims, 5 Drawing Sheets

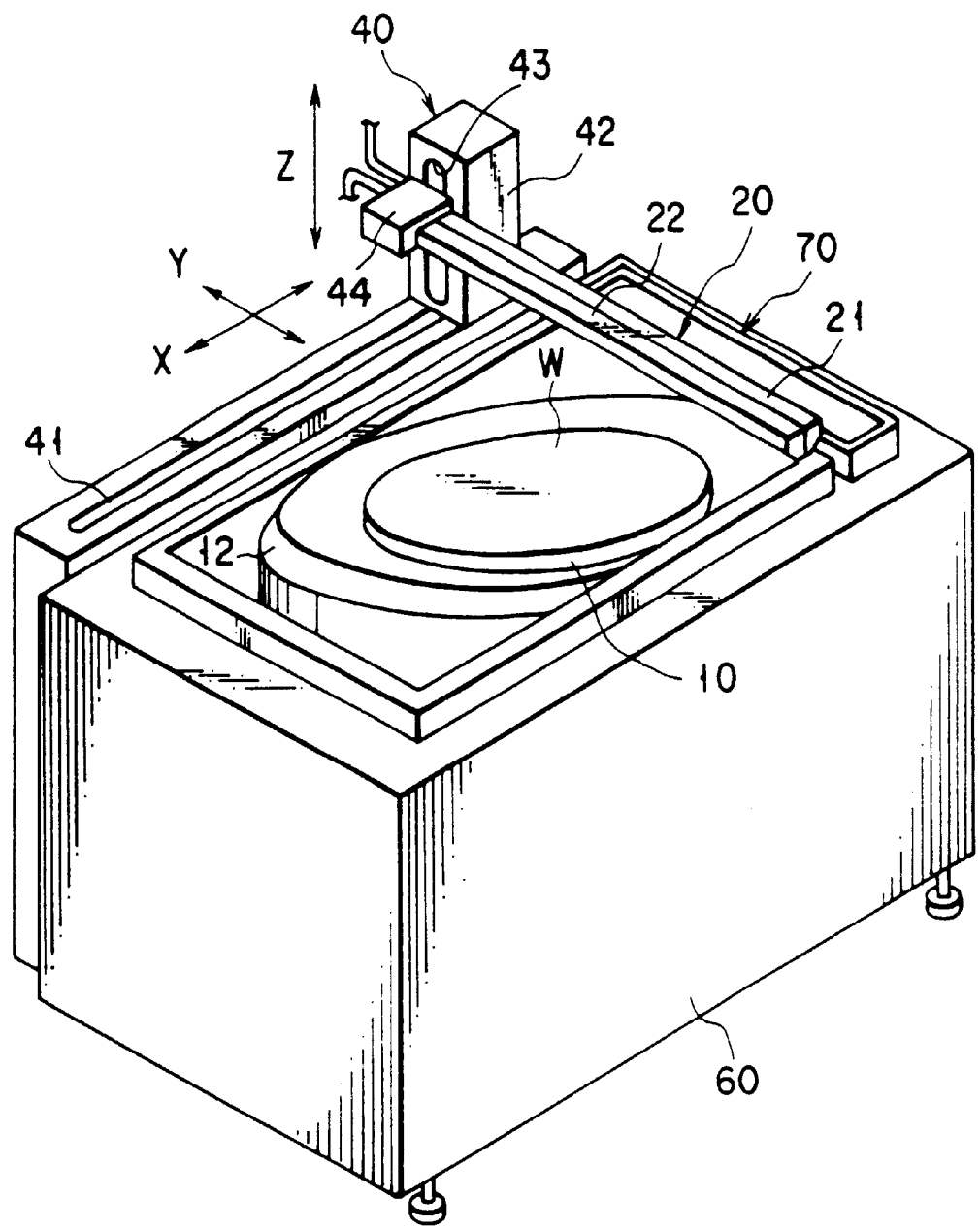
F I G. 1

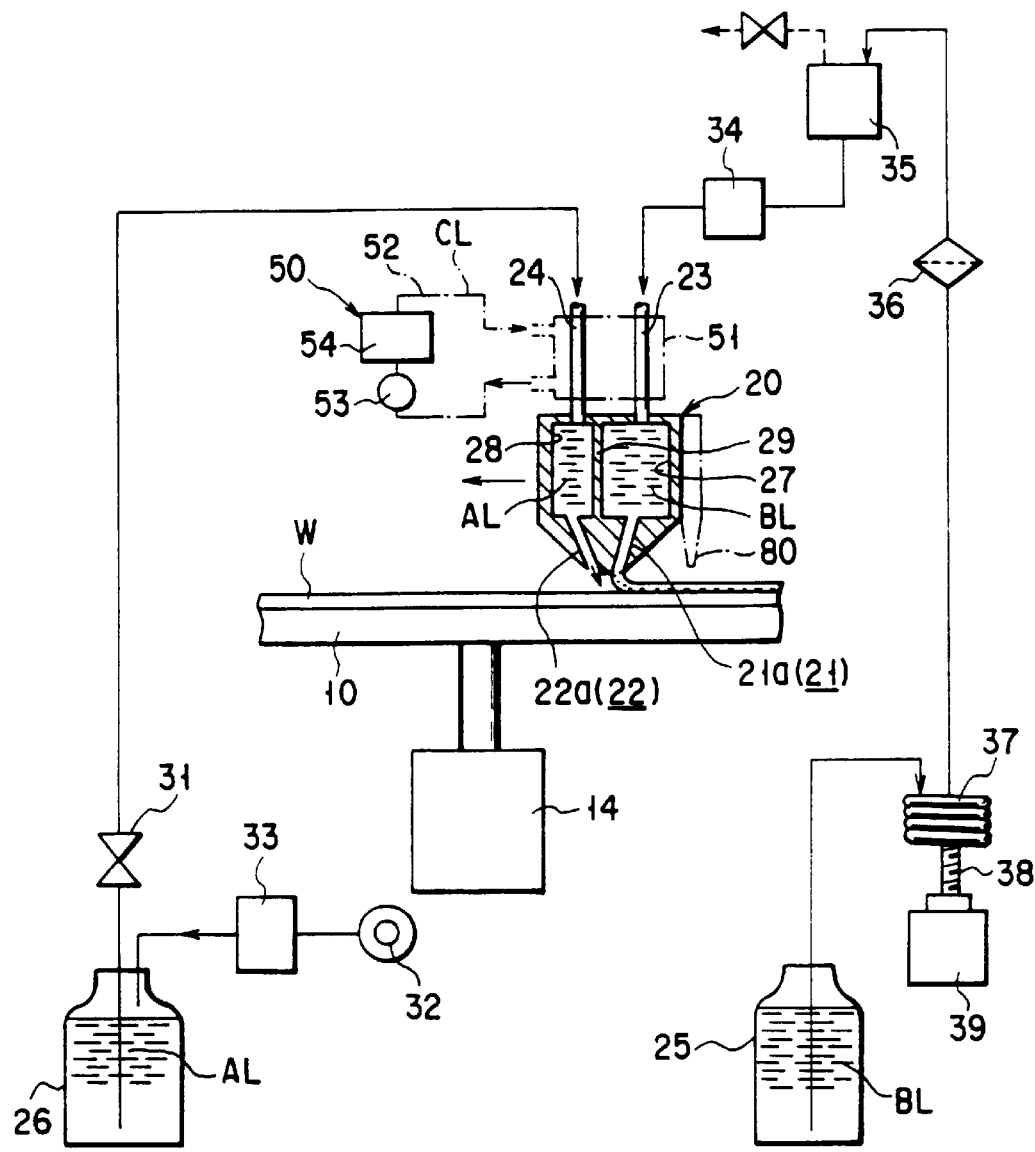
F I G. 2

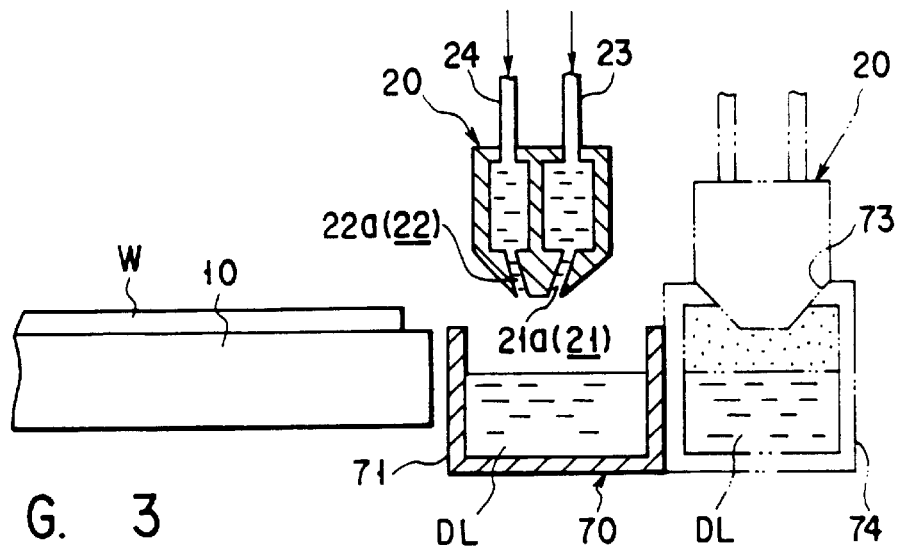
F I G. 3
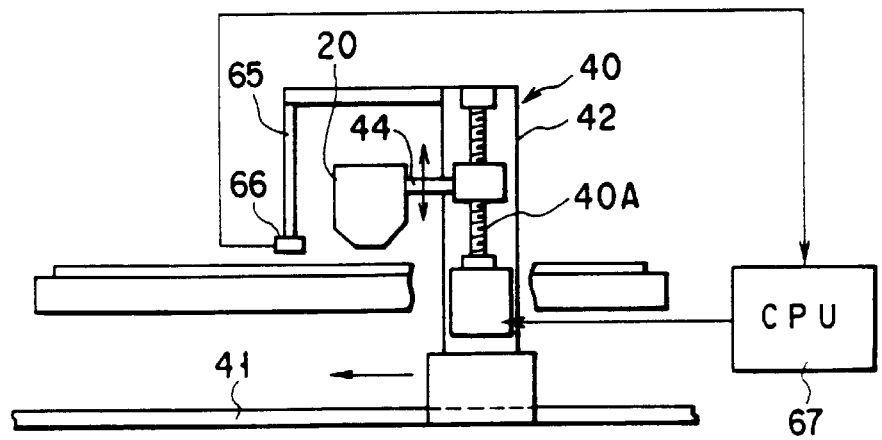
F I G. 4
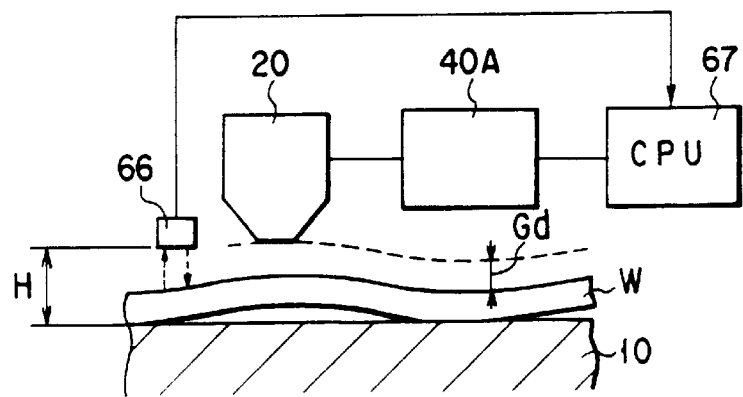
F I G. 5

COATING METHOD AND APPARATUS FOR SEMICONDUCTOR PROCESS

This application is a division of application Ser. No. 08/919,503, filed on Aug. 28, 1987, now U.S. Pat. No. 5,919,520

BACKGROUND OF THE INVENTION

The present invention relates to a coating method and apparatus for a semiconductor process, and, in particular, to a method and apparatus for coating a target substrate, such as a semiconductor wafer or an LCD substrate, with a coating liquid, such as a photo-resist liquid or a developing liquid. The semiconductor process includes various kinds of processes which are performed to manufacture a semiconductor device or a structure having, for example, wiring layers and electrodes to be connected to a semiconductor device on a target substrate, such as a semiconductor wafer or an LCD substrate, by forming semiconductor layers, insulating layers, and conductive layers in predetermined patterns on the target substrate.

In a process of manufacturing a semiconductor device or an LCD, coating apparatuses are utilized in various steps. A representative one of them is a coating apparatus of a photo-resist liquid, employed in a coating and developing system of the photo-resist. The photo-resist liquid is applied onto a target layer to be pattern-etched, such as a semiconductor, insulating, or conductive layer on a semiconductor, so as to form a photo-resist film on the target layer. The photo-resist film is exposed to light through a predetermined mask and is developed so that the film is patterned to copy the mask. Then, the target layer is etched, using the patterned photo-resist film as a mask.

Jpn. Pat. Appln. KOKAI Publication Nos. 7-8879, 7-8880, 7-8034, 7-80385, and 7-80386, and Jpn. U.M. Appln. KOKAI Publication No. 7-31168 disclose a coating method of a certain type for applying a photo-resist liquid. In this coating method, a target substrate and a nozzle for delivering the photo-resist liquid in a band shape are moved relative to each other in a direction perpendicular to the band of the photo-resist liquid, so that the top surface of the target substrate is coated overall with the photo-resist liquid.

However, this method entails the following problems. First, since a solvent contained in the photo-resist liquid is evaporated while the liquid is applied onto the target substrate from its one end to the other, there is a difficulty in forming a thin film, and the necessary amount of the photo-resist liquid is relatively large. Further, as shown in FIG. 8, more photo-resist liquid is applied at the start and end points of the coating process, thereby bringing about a difficulty in forming a film having a uniform thickness. Furthermore, the surface of the target substrate occasionally has a bad wettability relative to the photo-resist, depending on the properties of the surface, thereby bringing about difficulties in forming a film having a uniform thickness and in performing a process with a small amount of the photo-resist liquid.

BRIEF SUMMARY OF THE INVENTION

An object of the present invention, therefore, is to provide a coating method and apparatus for a semiconductor process, which can form a coating film having a uniform and thin thickness, and can decrease the necessary amount of a coating liquid.

According to a first aspect of the present invention, there is provided a coating method for a semiconductor process, of coating a target region of a substrate with a coating liquid, comprising:

a pre-coating step of coating the target region of the substrate with a solvent for the coating liquid, by supplying the solvent onto the target region from a solvent supply port while supporting the substrate by a support which supports the substrate substantially horizontal; and a main coating step of coating the target region of the substrate with the coating liquid after the pre-coating step, by supplying the coating liquid onto the target region from a coating liquid supply port while moving the substrate supported by the support and the coating liquid supply port relative to each other in a first direction.

According to a second aspect of the present invention, there is provided a coating apparatus for a semiconductor process, for coating a target region of a substrate with a coating liquid, comprising:

a support for supporting the substrate substantially horizontal;

a solvent supply port for supplying a solvent for the coating liquid onto the target region of the substrate supported by the support;

a coating liquid supply port for supplying the coating liquid onto the target region of the substrate supported by the support; and first sifting means for moving the substrate supported by the support and the coating liquid supply port relative to each other in a first direction.

In the present invention, a coating liquid is supplied after wettability of the surface of a target substrate is enhanced relative to the coating liquid, so that the coating liquid is not repelled even if its amount is small, thereby forming a coating film having a uniform and thin thickness. Further, since the coating liquid can be supplied in an optimum mixing ratio relative to a solvent when the coating film is formed, the necessary amount of the coating liquid to be used is decreased. Furthermore, since the solve and the coating liquid are brought into contact and mixed with each other, it is possible to cause the coating liquid to have a uniform viscosity and to prevent bubbles from being produced in the coating liquid.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view schematically showing a coating apparatus according to an embodiment of the present invention;

FIG. 2 is a structural view schematically showing the coating apparatus shown in FIG. 1;

FIG. 3 is a cross-sectional view showing a nozzle-waiting section of the coating apparatus shown in FIG. 1;

FIG. 4 is a side view schematically showing the main part of a coating apparatus according to another embodiment of the present invention;

FIG. 5 is an enlarged view for explaining the function of the structure shown in FIG. 4;

DETAILED DESCRIPTION OF THE INVENTION

Figure 6A:
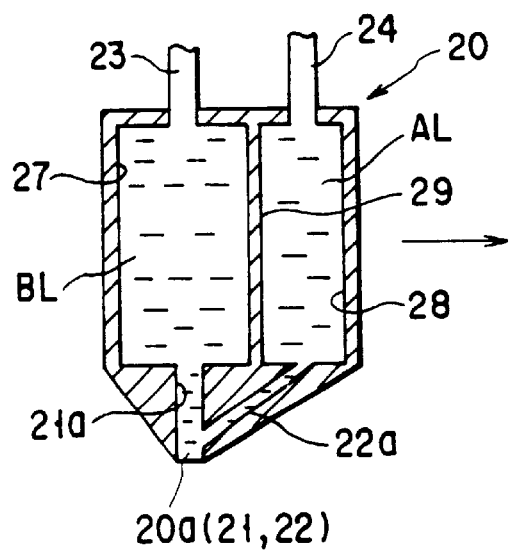
FIGS. 6A and 6B are cross-sectional views each showing a modification of a movable beam, which constitutes nozzles for respectively supplying a coating liquid and a solvent.

FIG. 1 is a perspective view schematically showing a coating apparatus according to an embodiment of the present invention. The coating apparatus 1 is constituted to coat a semiconductor wafer W with a photo-resist liquid.

As shown in FIGS. 1 and 2, the coating apparatus has a holder, such as a spin chuck 10 for attracting and holding a target substrate, i.e., a semiconductor wafer W, in a horizontal state by means of vacuum. A movable beam 20 is arranged above the spin chuck 10 such that it can be moved in an X direction by a scanning mechanism 40 from one end of the wafer W to the other end. The movable beam 20 constitutes first and second nozzles 21 and 22 which are integrally formed. The first nozzle 21 is used for supplying a photo-resist liquid, i.e., a coating liquid BL, while the second nozzle 22 is used for supplying a solvent AL for the photo-resist liquid. The first and second nozzles 21 and 22 are connected to a tank 25 of the coating liquid BL and a tank 26 of the solvent 26, respectively.

More specifically, the spin chuck 10 is arranged horizontal in a cup 12 and at the upper part of a box-like apparatus body 60. Suction holes connected to a vacuum device (not shown) are opened on the top surface of the spin chuck 10, so that the wafer W can be attracted and held on the spin chuck 10. The spin chuck 10 is rotated in a horizontal plane by a motor 14 arranged in the apparatus body 60, and is moved in a vertical direction by an elevating cylinder (not shown) arranged in the apparatus body 60. A waiting section 70 is arranged on the apparatus body 60 and apart from the spin chuck 10, for the movable beam 20 to wait at.

The movable beam 20 is formed of a hollow body of, for example, a stainless steel or aluminum alloy. The inside of the movable beam 20 is partitioned along its longitudinal direction by a partition wall 29, so that it is divided into two independent rooms, i.e., first and second rooms 27 and 28 arranged on the back and front sides, respectively, in a direction in which the beam 20 is moved during a coating process. The first and second rooms 27 and 28 function as reservoirs of the first and second nozzles 21 and 22 for supplying the coating or photo-resist liquid BL and the solvent AL, respectively.

A slit 21a is formed to extend in a longitudinal direction of the beam 20, i.e., in a Y direction perpendicular to the X direction in which the beam 20 is moved, such that the slit 21a communicates with the first room 27 and is opened downward. Similarly, a slit 22a is formed to extend in the Y direction, such that the slit 22a communicates with the second room 28 and is opened downward. In other words, the slits 21a and holes 22a constitute delivery ports of the first and second nozzles 21 and 22, respectively, which are arranged in two rows extending in the Y direction and are opened closely to each other. The slits 21a and 22a are arranged such that a position on the wafer W to which the solvent AL is supplied is always located ahead of a position on the wafer W to which the coating liquid BL is supplied, in the moving direction of the beam 20.

Each of the slits 21a and 22a desirably has such a length that the coating liquid BL or the solvent AL is delivered substantially all over the entire width of a target region all at once in the Y direction. The target region is a region to be coated with the coating liquid BL, on the wafer W. In this embodiment, since the top surface of the wafer W is to be entirely coated with the coating liquid BL, the top surface of the wafer W can be defined as the target region as a whole.

Each of the delivery ports off the first and second nozzles 21 and 22 may be formed of a number of holes arrayed at intervals in the Y direction, in place of the slit. Further, in the embodiment, each of the delivery ports of the first and second nozzles 21 and 22 is arranged such that the coating liquid BL or the solvent AL is delivered substantially all over the entire width, in the Y direction, of a target region on the wafer W, all at once. However, this is not essential, because the coating liquid BL and solvent AL can be diffused on the wafer W by means of rotation of the spin chuck 10. For example, each of the delivery ports of the first and second nozzles 21 and 22 may be formed of a short slit, or a tip opening of an ordinary nozzle pipe extending vertically.

The first room 27 of the movable beam 20 is connected through a tube 23 to the tank 25 containing the coating or photo-resist liquid BL. The photo-resist liquid contains a solvent of, e.g., ketone series, cellosolve series, ester series, glycol series, or nitrogen containing series, as the solution solvent of the liquid, and also contains a photosensitive resin as the solute of the liquid. The second room 28 of the movable beam 20 is connected through a tube 24 and an open/close valve 31 to the tank 26 containing the solvent AL. Although any solvent, which dissolves the coating or photo-resist liquid BL, can be used as the solvent AL, the solvent AL desirably consists essentially of the solution solvent of the coating or photo-resist liquid BL.

The tank 26 containing the solvent AL is connected to a nitrogen ($N_2$) gas source 32 through a flow control valve 33. The flow rate of the $N_2$ gas is controlled by the control valve 33 to adjust pressure to the tank 26, so that the solvent AL in the tank 26 is supplied onto the wafer W in a predetermined amount. The operation of the flow control valve 33 is automatically controlled by a computer on the basis of a preset program.

Between the second tube 23 and the tank 20 of the coating liquid BL, there are an air operation valve 34, a bubble removing mechanism 35 for removing bubbles in the coating liquid BL, a filter 36, and a flow controller 37, such as a bellows pump. The flow controller 37 is expandable under control of a driving unit so as to send a predetermined amount of the coating liquid BL to the first nozzle 21. The predetermined amount of the coating liquid BL sent from the flow controller 37 is supplied, e.g., dropped, as the coating liquid from the first nozzle 21 onto the center of the wafer W.

The flow controller 37 can control the supply rate of the photo-resist liquid down to a small amount as compared to a conventional technique. The driving unit has a ball screw member 38 formed of a screw connected to the flow controller 37 and a nut engaging with the screw. The ball screw member 38 is driven by a servo motor or stepping motor 39 including a servo mechanism, which rotates the nut to linearly move the screw.

In the above described system of supplying the photo-resist or coating liquid, the delivery time of the coating liquid BL is controlled by means of the driving time of the stepping motor 39 of the flow controller 37. The delivery rate of the coating liquid BL is adjusted by means of driving conditions of the flow controller 37, such as driving time and driving speed, and opening/closing operation, i.e., ON/OFF operation, of the valve 34 for opening/closing the coating liquid passageway. Setting the driving time of the flow controller 37 and the ON/OFF operation of the valve 34 are automatically controlled by the computer on the basis of a preset program.

The delivery time of the coating liquid BL may be controlled by an opening/closing operation of a variable orifice (not shown) arranged in the first nozzle 21. Further, the coating liquid BL may be performed by pressurizing the tank 25 with $N_2$ gas. In this case, it is possible to control the delivery time of the coating liquid BL by adjusting the pressure of the $N_2$ gas, without using the flow controller 37.

A temperature controlling mechanism 50 for setting the coating liquid BL and the solvent AL to a predetermined temperature, such as 23° C., is arranged on their supply lines. More specifically, as shown with phantom lines in FIG. 2, the temperature controlling mechanism 50 includes a supply line 51 for supplying a temperature-adjusted liquid CL, such as constant temperature water, arranged to surround the first and second tubes 23 and 24. A circulation line 52 is connected to the terminal ends of the supply line 51, and is provided with a circulation pump 53, and thermomodule 54 for keeping the temperature-adjusted liquid CL at a constant temperature. With this arrangement, the coating liquid BL and solvent AL flowing in the first and second tubes 23 and 24 are kept at a predetermined temperature, such as about 23° C., by the temperature controlling mechanism 50.

As shown in FIG. 3, a tank 71 containing a solvent DL, such as thinner, for preventing the tip of the first nozzle 21 from drying, is arranged in the waiting section 70. In place of the tank 71, as shown with phantom lines in FIG. 3, a bath 74 may be arranged to have an opening 73 into which the lower portions of the first and second nozzles 21 and 22 are inserted. Further, a member for spouting the solvent DL upward and washing the tip of the first nozzle 21 may be arranged in the tank 71 or the bath 74.

The scanning mechanism 40 has a column 42 which is movable in the X direction along a linear guide 41 arranged on an outer side of the apparatus body 60. The column 42 is provided with a holder 44 which is movable in a vertical direction, i.e., Z direction, along a guide 43 on the column 42. The movable beam 20 constituting the first and second nozzles 21 and 22 is supported by the holder 4, such that the slits 21a and 22a at the bottom of the nozzles 21 and 22 are horizontal. The movable beam 20 is moved in the X and vertical directions, which are perpendicular to the slits 21a and 22a, by a linear driver and an elevator, such as a ball screw, (not shown).

An explanation will be given about a coating method according to the present invention, using the coating apparatus having the above described structure.

First, the wafer W is transferred onto the spin chuck 10, which has been kept stationary, by a transfer arm (not shown), and is attracted and held on the spin chuck 10 by means of vacuum suction. On the other hand, the coating liquid, i.e., the photo-resist liquid left in the tip of the first nozzle 21 is delivered into the tank 71 and removed from the tip by means of a dummy dispense operation. Then, the movable beam 20 is moved in the X direction while remaining parallel to the wafer W thereabove. During this movement, onto the wafer W, the solvent AL is first supplied from the second nozzle 22, followed by the coating or photo-resist liquid BL supplied from the first nozzle 21. By doing so, so-called wettability of the wafer W relative to the photo-resist liquid BL is increased, prior to the supply of the liquid BL, so that the wafer W can be coated with the photo-resist liquid BL having a uniform and thin film thickness. Then, the spin chuck 10 is rotated along with the wafer W by the motor 14, to further increase the film thickness uniformity of the photo-resist liquid.

The amount of the solvent AL supplied onto the opposite ends of the wafer W in the X direction may be set higher than those amounts supplied onto the other portions of the wafer W, when the solvent AL and the coating or photo-resist liquid BL are supplied. This adjustment can be performed by increasing the supplied amount of the solvent AL by a predetermined amount at the start and end of the coating process, using the flow controller 33. With this operation, the coating or photo-resist liquid BL comes to have a lower viscosity and is more easily spread on the opposite ends of the wafer W in the X direction, at which the solvent AL is supplied more than at the other portions. As a result, the coating liquid BL is prevented from forming a puddle, so that the coating liquid film can have a uniform film thickness all over the top surface of the wafer W. Further, although the coating liquid BL is apt to be delivered in a larger amount at the beginning of delivery, this beginning part of the coating liquid is removed by the dummy dispense, thereby performing the coating process with a stable delivery amount.

As described above, the solvent AL is first supplied onto the wafer W to increase its wettability, and then the coating liquid BL is supplied, in a coating method according to the present invention, so as to coat the wafer W with the coating liquid BL having a uniform and thin film thickness. Consequently, the coating method according to the present invention includes, in its concept, a pre-coating step of applying the solvent AL and a main coating step of applying the coating liquid BL. In this embodiment, the pre-coating step and the main coating step are simultaneously performed to overlap their effective periods of time with a slight time lag therebetween. However, the pre-coating step and the main coating step may be performed so as not to overlap their effective periods of time at all. The coating method, using the coating apparatus shown in FIG. 2, can be modified as described in the following examples (1) to (3).

(1) After the solvent AL is supplied, the wafer W is rotated to diffuse the solvent AL all over the wafer W. Then, the coating liquid BL is supplied while the movable beam 20 is moved. In this case, the solvent AL may be supplied only onto the center of the wafer W.

(2) In addition to the steps of the example (1), the wafer W is rotated again to cause the coating liquid film to be uniform after the coating liquid BL is supplied.

(3) The solvent AL is supplied while the wafer W is rotated. Then, the coating liquid BL is supplied while the movable beam 20 is moved. Then, the wafer W is rotated again to cause the coating liquid film to be uniform.

FIGS. 4 and 5 are views schematically showing the main part of a coating apparatus according to another embodiment of the present invention.

In the above described embodiment, the first and second nozzles 21 and 22 are moved in a plane of a constant height above the spin chuck 10. In place of this arrangement, the first and second nozzles 21 and 22 may be controlled over their height, in light of the unevenness of the wafer W, i.e., the vertical positions of the top surface of the wafer W. For this purpose, a height sensor 66 is used as means for detecting heights of the top surface of the wafer W, e.g., in a manner as shown in FIGS. 4 and 5. The sensor 66 is attached to the bottom end of a support 65, which has a reversed L-shape and is arranged to extend toward ahead of the movable beam 20 from the column 42 of the scanning mechanism 40.

The sensor 66 is arranged such that a position on the wafer W which is sensed by the sensor 66 is always located ahead of positions on the wafer W to which the coating liquid BL and the solvent AL are supplied, in the moving direction of the beam 20. Detected height signals along the center of the wafer W in the X direction, which are obtained by the sensor 66, are transmitted to a control section, such as a central processing unit (CPU) 67. Control signals are sent to a nozzle elevator 40A of the scanning mechanism 40 from the CPU 67, on the basis of the height signals. By doing so, the height H of the first and second nozzles 21 and 22 from the spin chuck 10 is continuously controlled, so that the distance Gb between each of the delivery ports at the lower ends of the nozzles 21 and 22 and the top surface of the wafer W is kept constant.

In order to detect the height of the wafer W and to control the distance Gb, a sensor or sensors of the point-sensing type may be used as the height sensor 66. In this case, it is possible to detect the height of one point every moment along the diameter of the wafer W, as described above, or to detect the height of three points every moment along the diameter of the wafer W and along lines one on either side of the diameter, in order to control the distance Gb on the basis of the average value of the three points. Alternatively, a sensor of the line sensor type may be used as the height sensor 66. In this case, it is possible to detect the heights of plural points on the wafer W every moment, in order to control the distance Gb on the basis of the average value of the plural points.

The height sensor 66 may be supported by a scanning mechanism other than the scanning mechanism 40 for the nozzles. In this case, since the sensor 66 can perform a scanning operation independently, the height of the top surface of the wafer W may be detected prior to the coating process. Further, a sensor of the line sensor type for detecting the top surface of the wafer W may be arranged to be independently movable, so that the height of the wafer W is detected while the sensor is moved in parallel to the wafer W. Furthermore, the movable beam 20 may be divided into a plurality of segments in the Y direction, which are independently adjustable in height, in order to control the distance Gb by the segments.

In the structure shown in FIG. 2, the first and second nozzle 21 and 22 are integrally formed to be one movable beam 20. However, the first and second nozzles 21 and 22 are not necessarily formed as one unit, but may be independently formed and closely arranged.

Flattening means, such as a spatular member, for flattening the top surface of the coating or photo-resist liquid, may be arranged close to the slit 21a of the first nozzle 21. With this arrangement, ridges on the top surface of the delivered photo-resist liquid are forced to be flat, so that a uniform film thickness is obtained. In this case, the spatular member may be independently formed and attached to the movable beams, or may be integrally formed with the movable beam 20.

In the structure shown in FIG. 2, the solvent AL and the photo-resist liquid BL are independently delivered. Instead, the solvent AL and the photo-resist liquid BL may be delivered after they are mixed. For example, as shown in FIG. 6A, the slit 22a of the second nozzle 22 is connected to a halfway point of the passage to the slit 21a of the first nozzle 21, and the solvent AL and the photo-resist liquid BL are delivered through a common slit 20a. With this arrangement, the viscosity, concentration, and the like of the photo-resist liquid BL can be adjusted in the movable beam 20.

Figure 6B:
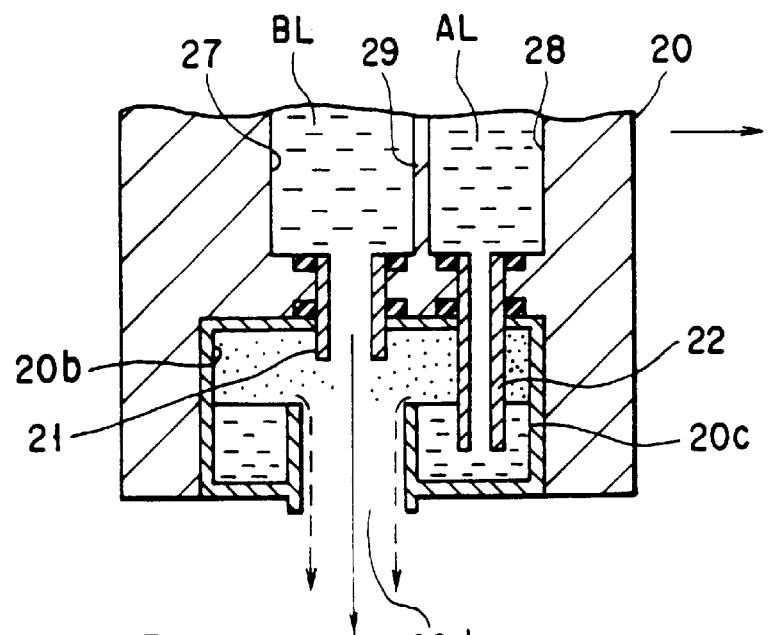

Further, a structure as shown in FIG. 6B may be adopted. More specifically, a bore 20b is formed inside the lower part of a movable beam 20 to accommodate the bottom openings of first and second nozzles 21 and 22. A solvent reservoir 20c is arranged in the bore 20b to surround an opening 20d of the bore 20b. The second nozzle 2 is inserted in the solvent reservoir 20c. In this structure, the solvent AL reserved in the solvent reservoir 20c is evaporated to form a solvent atmosphere in the bore 20b, so that the viscosity and concentration of the photo-resist liquid can be adjusted before delivery. The solvent AL is delivered from the opening 20d by it overflowing from the solvent reservoir 20c and flowing out of the opening 20d.

A nozzle for spouting a solvent vapor toward the bottom of the movable beam 20 may be arranged so as to form an atmosphere full of the solvent vapor at a position facing the wafer W, while the photo-resist liquid BL is supplied. Further, the entire top surface of the wafer W may be covered with the solvent vapor, while the photo-resist liquid BL is supplied.

The present invention may be applied to a coating apparatus of a developing liquid other than the photo-resist liquid. In this case, a developing liquid and water are defined as the coating liquid BL and the solvent AL, respectively. More specifically, the wafer W is first coated with water used as the solvent AL to increase wettability of the wafer W relative to the developing liquid, and is then coated with developing liquid used as the coating liquid BL, thereby forming a uniform film of the developing liquid on the wafer W. Note that in a coating apparatus of the developing liquid, a drying mechanism is necessary for drying the surface of the wafer W after it is coated with the developing liquid. For example, where the spin chuck 10 is used as supporting means of the wafer W, the drying step can be performed by a so-called spin drying operation, in which the wafer W is rotated by the spin chuck 10 at a high speed. Instead, it is possible to use an air nozzle 80 which has spouting holes along the entire length of the movable beam 20 and is arranged on the beam 20. In this case, after performing the coating process, the movable beam 20 is again moved in the X direction above the wafer W so as to spout air onto the entire top surface of the wafer W. By doing so, the surface of the wafer W is dried by a so-called air knife operation.

Figure 7:
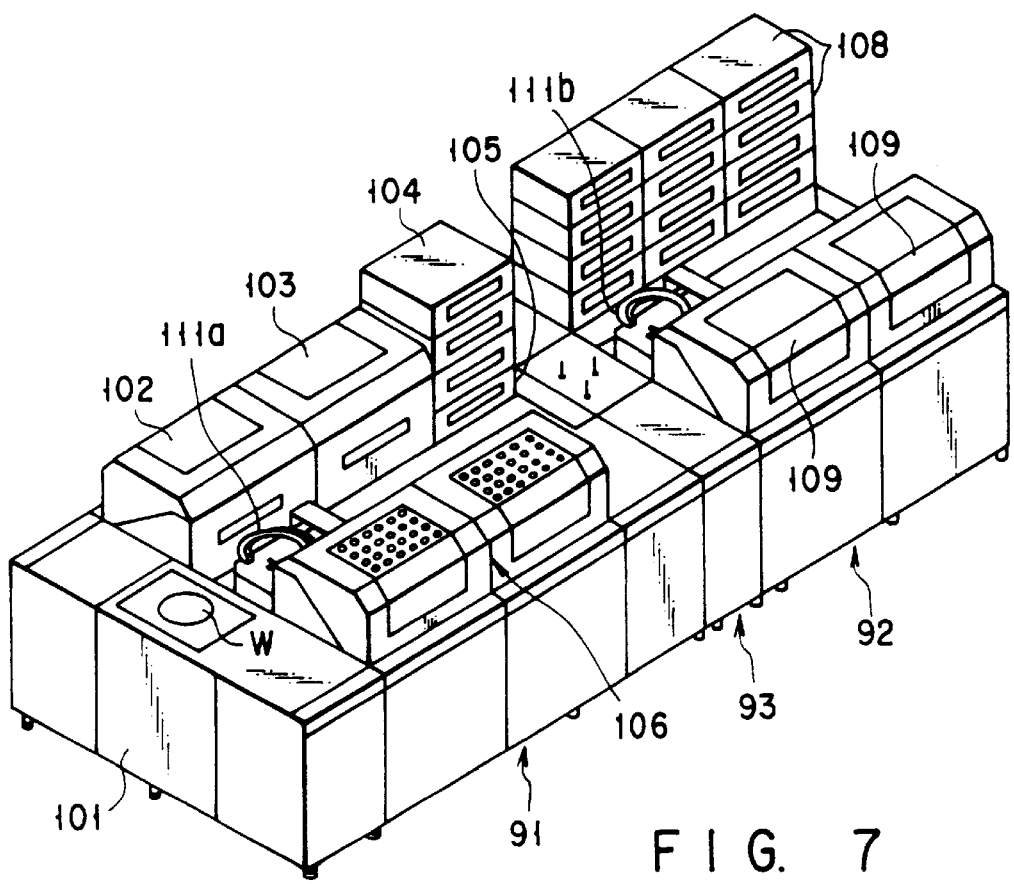
FIG. 7 is a perspective view showing a coating and developing system having the coating apparatus shown in FIG. 1.
Figure 8:
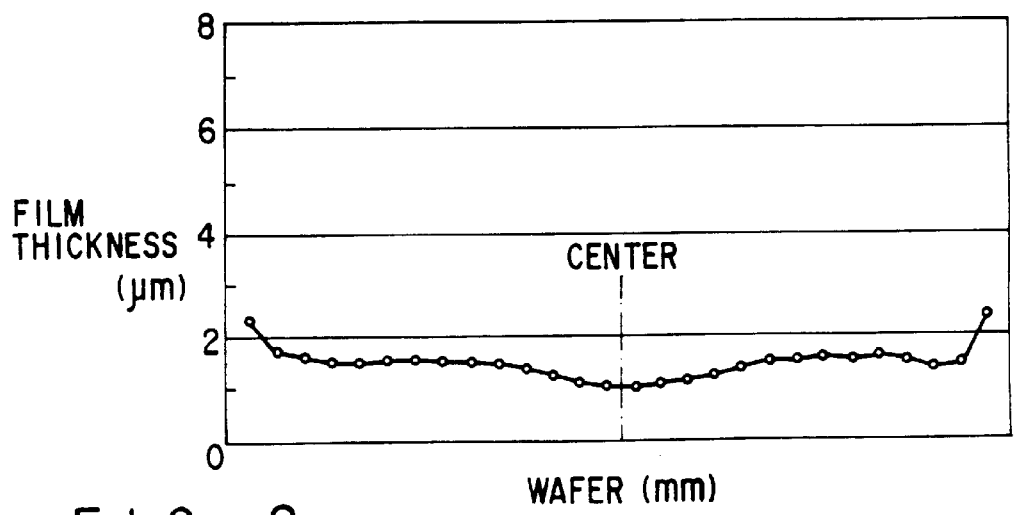
FIG. 8 is a graph showing a distribution in a photo-resist film thickness according to a conventional method of forming a photo-resist film.

A coating apparatus according to the present invention may be used as an independent coating apparatus for coating a semiconductor wafer or an LCD substrate with a developing liquid or a photo-resist liquid, or may be used as a unit incorporated in a coating and developing system as shown in FIG. 7.

The coating and developing system shown in FIG. 7 has a loading section 101, a first processing block 91 next to the loading section 101, and a second processing block 92 connected to the first processing block 91 through an interface section 93. The loading section 101 is used for transferring semiconductor wafers W to be processed into and out of the system.

In the first processing block 91, a brush scrubbing apparatus 102 for brush-scrubbing and washing a wafer W is arranged adjacent to the loading section 101. A jet-water washing apparatus 103 for washing the wafer W by means of jet water of a high-pressure is arranged next to the brush scrubbing apparatus 102. Further, an adhesion apparatus 104 for subjecting the surface of the wafer W to a hydrophobic treatment is arranged next to the jet-water washing apparatus 103. A cooling apparatus 105 for cooling the wafer W down to a predetermined temperature is arranged under the adhesion apparatus 104. A photo-resist coating apparatus 106 is arranged to face the apparatuses 102 to 105 through a wafer transfer passage. The photo-resist coating apparatus 106 has a coating mechanism for coating the wafer W with a photo-resist, and a coating film removing mechanism for removing an unnecessary part of the photo-resist film on the marginal region of the wafer W. The coating mechanism of the photo-resist coating apparatus 106 has a structure, as described with reference to FIGS. 1 to 3. A wafer transfer arm 111a is arranged on the wafer transfer passage to be movable along the passage.

In the second processing block 92, a heating apparatus 108 is arranged for heating the wafer W before and after the photo-resist coating process, to perform pre-baking and post-baking treatments. A developing apparatus 109 is arranged to face the heating apparatus 108 through the wafer transfer passage. The developing apparatus 109 has members for subjecting the wafer, which has been light-exposed, to a developing treatment, and for rinsing the developed photo-resist pattern. A wafer transfer arm 111b is arranged on the wafer transfer passage to be movable along the passage. A light-exposing apparatus (not shown) is connected to the second processing block 92 on the far side, for projecting a circuit pattern of chips, which are to be formed on the wafer W, onto photo-resist film on the wafer W.

In the coating and developing system having the above described structure, an unprocessed wafer W is received by the wafer transfer arm 111a from the loading section 101, and is transferred into the brush scrubbing apparatus 102. After being subjected to a brush scrubbing and washing treatment in the brush scrubbing apparatus 102, the wafer W is cleaned by means of jet water of a high-pressure in the jet-water washing apparatus 103. After being cleaned, the wafer W is subjected to a hydrophobic treatment in the adhesion apparatus 104. Then, the wafer W is cooled in a cooling apparatus 105, and is transferred into the photo-resist coating apparatus 106. In the coating apparatus, the photo-resist liquid is applied onto the wafer W to form a coating film in accordance with the above described sequence, and then an unnecessary part of the photo-resist film on the marginal region of the wafer W is removed. As a result, when being delivered therefrom, the wafer W has no photo-resist film on its edge, so that no photo-resist film adheres to the transfer arms 111a and 111b.

Then the photo-resist film left on the wafer is subjected to a baking treatment by means of heating in a heating apparatus 108, and is exposed to light with a predetermined pattern in the light-exposing apparatus (not shown). After being light-exposed, the wafer W is transferred to the developing apparatus 109, and is subjected to a developing treatment with a developing liquid. Then, the developing liquid is washed out by a rinsing liquid, so that the developing treatment is completed. After the developing treatment, the wafer W is transferred into a cassette (not shown) in the loading section 101, and is then transferred therefrom to the next process.

In the above described embodiment, the present invention is applied to a coating apparatus for coating a semiconductor wafer or an LCD substrate with a coating liquid, such as a developing liquid or a photo-resist liquid. The present invention, however, may be applied to a coating apparatus of another type, e.g., for coating another target substrate, such as a CD, with a coating liquid, or for coating an electric board with a green film. Further, another coating liquid, such as a polyimide-based coating liquid (PIQ) or a coating liquid containing a glass component (SOG) may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for coating a target region of a substrate selected from the group consisting of a semiconductor wafer and a liquid crystal display substrate with a photo-resist, comprising:

a support configured to support said substrate substantially horizontal;

a solvent supply port configured to supply a solvent for said photo-resist from a source of solvent into a first area above the substrate for deposit onto said target region of said substrate supported by said support;

a photo-resist supply port configured to supply said photo-resist from a source of photo-resist into a second area above the substrate for deposit onto said target region of said substrate supported by said support, the photo-resist supply port being separated from the solvent supply port by a distance that substantially prevents said solvent and said photo-resist from being in contact when supplied into the first and second areas above the substrate; and a shifting member configured to move said ports relative to said substrate supported by said support, in a straight line direction from a location adjacent to a first end portion of said target region to a location adjacent to a second end portion of said target region, such that said photo-resist supply port is moved along with but immediately behind said solvent supply port in said straight line direction, while said solvent and said photo-resist are being supplied, wherein said solvent supply port and said photo-resist supply port are further configured to respectively supply said solvent and said photo-resist substantially out of contact into the first and second areas above the substrate substantially across a full width dimension of said substrate all at once, said full width dimension of said substrate being measured in a direction perpendicular to said straight line direction.

2. The apparatus according to claim 1, wherein said support is capable of rotating said substrate in a horizontal plane.

3. The apparatus according to claim 1, comprising a member configured to supply an amount of said solvent onto each of said first and second end portions of said target region that is larger than an amount of said solvent supplied onto any other portion of said target region.

4. The apparatus according to claim 1, comprising a sensor configured to detect height variations of a surface of said target region facing said ports, and a member configured to cause a distance between said surface of said target region facing said ports and said ports to be maintained constant based on the height variation detected by said sensor.

5. The apparatus according to claim 4, wherein said sensor is moved by said shifting member along with said ports such that a position on said target region being detected by said sensor is located ahead of a position on said target region being supplied with said solvent, in said straight line direction.

6. The apparatus according to claim 1, wherein said shifting member and said distance between said solvent supply port and said photo-resist supply port are designed such that said solvent is first supplied onto said target region to increase wettability of said target region relative to said photo-resist by said solvent, and then said photo-resist is supplied onto said target region.

7. The apparatus according to claim 1, further comprising a temperature control section configured to control temperatures of first and second lines, which supply said solvent and said photo-resist to said solvent supply port and said photo-resist supply port, respectively.

8. The apparatus according to claim 7, wherein said temperature control section is configured to adjust said solvent and said photo-resist in said first and second lines to substantially the same temperature by a common thermo-medium.

* * * * *